US012639487B2

(12) United States Patent
Da Silveira Junior et al.

(10) Patent No.: US 12,639,487 B2
(45) Date of Patent: May 26, 2026

(54) WORKLOAD GENERATOR AND SIMULATOR FOR STORAGE CACHING SYSTEMS

(71) Applicant: EMC IP Holding Company LLC, Hopkinton, MA (US)

(72) Inventors: Jaumir Valenca Da Silveira Junior, Rio de Janeiro (BR); Vinicius Michel Gottin, Rio de Janeiro (BR)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 1115 days.

(21) Appl. No.: 17/160,656

(22) Filed: Jan. 28, 2021

(65) Prior Publication Data

US 2022/0237339 A1 Jul. 28, 2022

(51) Int. Cl.
*G06F 8/77* (2018.01)
*G06F 30/20* (2020.01)

(52) U.S. Cl.
CPC ................ *G06F 30/20* (2020.01); *G06F 8/77* (2013.01)

(58) Field of Classification Search
CPC ........................................................ G06F 8/77
See application file for complete search history.

(56) References Cited

U.S. PATENT DOCUMENTS

| | | | | |
|---|---|---|---|---|
| 6,505,117 B1 * | 1/2003 | Ratert | ................ | G01C 21/3446 |
| | | | | 701/533 |
| 9,998,562 B1 * | 6/2018 | Peterson | ................. | H04L 67/60 |
| 2006/0212661 A1 * | 9/2006 | Inagaki | .............. | G06F 13/1673 |
| | | | | 711/147 |
| 2012/0210282 A1 * | 8/2012 | Iwashita | ............. | G06F 30/3308 |
| | | | | 716/108 |
| 2013/0223137 A1 * | 8/2013 | Yoshimoto | ............ | G11C 11/413 |
| | | | | 365/154 |
| 2013/0317802 A1 * | 11/2013 | Yamazaki | ........... | G06F 30/3312 |
| | | | | 703/14 |
| 2016/0034394 A1 * | 2/2016 | Mckean | .............. | G06F 12/0891 |
| | | | | 709/217 |
| 2017/0342961 A1 * | 11/2017 | Saxena | ................... | F03D 13/00 |
| 2018/0060464 A1 * | 3/2018 | Matsumoto | ............. | G06F 30/20 |
| 2019/0334770 A1 * | 10/2019 | Xiang | ................ | H04L 41/0896 |
| 2019/0361808 A1 * | 11/2019 | Subramanian | ........... | G06N 3/04 |
| 2021/0089471 A1 * | 3/2021 | Lu | .......................... | G06F 3/0665 |
| 2021/0173767 A1 * | 6/2021 | Zhang | ................. | G06F 11/3698 |

* cited by examiner

*Primary Examiner* — Jae U Jeon
(74) *Attorney, Agent, or Firm* — Chamberlain, Hrdlicka, White, Williams & Aughtry; Aly Z. Dossa

(57) ABSTRACT

A method and system for calibrating a simulator instance is disclosed. Specifically, the method and system disclosed herein may receive, by a workload generator, a trace file specifying operations; generate, by the workload generator, a workload based on the operations, wherein the workload includes one or more read or write requests corresponding to the operations of the workload; receive, by the simulator instance, the read or write requests from the workload generator; and process, by the simulator instance, the read or write requests based on a set of simulation parameters to generate simulation results, wherein the simulation instance is calibrated, at least in part, based on the simulation results.

11 Claims, 9 Drawing Sheets

_600_

| record_id | milliseconds | cpu | origin | SSD_lba | HDD_lba | blockCount | opcode | fru | lunid |
|---|---|---|---|---|---|---|---|---|---|
| 239 | 9.694121e+09 | 8 | FCT | 0 | 1076320 | 16 | Read Start | 176 | 4 |
| 240 | 9.694121e+09 | 8 | FCT | 190787840 | 1076320 | 0 | Promote Start | 180 | 0 |
| 244 | 9.694121e+09 | 8 | FCT | 190787840 | 1076320 | 8408 | Write Flash Start | 184 | 3 |
| 247 | 9.694121e+09 | 0 | FCT | 190787840 | 1076320 | 8408 | Write Flash Finish | 184 | 3 |
| 248 | 9.694121e+09 | 0 | FCT | 0 | 1076320 | 1 | Internal Dir Update Start | 181 | 1 |

| record_id | milliseconds | cpu | origin | lba | blockCount | opcode | |
|---|---|---|---|---|---|---|---|
| 239 | 9.694121e+09 | 8 | FCT | 1.076320e+06 | 16 | Read Start | 722A |
| 240 | 9.694121e+09 | 8 | FCT | 1.076320e+06 | 0 | Promote Start | 724A |
| 242 | 9.694121e+09 | 8 | FBE_LUN | 6.840228e+18 | 128 | Normal Priority Read Start | |
| 243 | 9.694121e+09 | 8 | FBE_LUN | 1.433974e+19 | 128 | Normal Priority Read Finish | |
| 244 | 9.694121e+09 | 8 | FCT | 1.076320e+06 | 8408 | Write Flash Start | 726A |
| 245 | 9.694121e+09 | 0 | FBE_LUN | 1.433974e+19 | 128 | Normal Priority Write Start | |
| 246 | 9.694121e+09 | 0 | FBE_LUN | 1.433974e+19 | 128 | Normal Priority Write Finish | |
| 247 | 9.694121e+09 | 0 | FCT | 1.076320e+06 | 8408 | Write Flash Finish | 726B |
| 248 | 9.694121e+09 | 0 | FCT | 1.076224e+06 | 1 | Internal Dir Update Start | |
| 249 | 9.694121e+09 | 0 | FCT | 1.076224e+06 | 1 | Internal Dir Update Finish | |
| 250 | 9.694121e+09 | 8 | FCT | 1.076320e+06 | 16 | Promote Finish | 724B |
| 251 | 9.694121e+09 | 8 | FCT | 1.076320e+06 | 16 | Read Finish | 722B |
| 256 | 9.694121e+09 | 0 | FCT | 8.494272e+06 | 16 | Read Start | |

*FIG. 7*

| start_rid | address | operation | finish_rid | response_time |
|---|---|---|---|---|
| 239 | 1076320 | Read | 251 | 15.091013 |
| 240 | 1076320 | Promote | 250 | 15.064396 |
| 244 | 1076320 | Write Flash | 247 | 0.596355 |
| 248 | 1076224 | Internal Dir Update | 249 | 0.622541 |
| 256 | 8494272 | Read | 259 | 2.555569 |

900

| start_rid | address | operation | finish_rid | response_time | parent_rid |
|---|---|---|---|---|---|
| 239 | 1076320 | Read | 251 | 15.091013 | NaN |
| 240 | 1076320 | Promote | 250 | 15.064396 | 239.0 |
| 244 | 1076320 | Write Flash | 247 | 0.596355 | 240.0 |
| 248 | 1076224 | Internal Dir Update | 249 | 0.622541 | NaN |
| 256 | 8494272 | Read | 259 | 2.555569 | NaN |

| record _id | r_hits_rba | w_hits_rba | r_misses_rba | w_misses_rba | promotions_ hits_rba | promotions_ misses_rba | pages_ flushed_rba |
|---|---|---|---|---|---|---|---|
| 239 | 0.0 | 0.0 | 0.0 | 0.0 | 1.0 | 1 | 0 |
| 256 | 0.0 | 0.0 | 1.0 | 0.0 | 0.0 | 0 | 0 |
| 270 | 0.0 | 0.0 | 1.0 | 0.0 | 0.0 | 0 | 0 |
| 280 | 1.0 | 0.0 | 0.0 | 0.0 | 0.0 | 0 | 0 |
| 292 | 0.0 | 0.0 | 1.0 | 0.0 | 0.0 | 0 | 0 |

1100

| record_id | lba | blockCount | operation |
|---|---|---|---|
| 239 | 1076320 | 16 | read |
| 256 | 8494272 | 16 | read |
| 270 | 7880720 | 16 | read |
| 280 | 1048624 | 16 | read |
| 292 | 11396032 | 16 | read |

WORKLOAD GENERATOR AND SIMULATOR FOR STORAGE CACHING SYSTEMS

BACKGROUND

Simulators are useful tools in a testing environment as they seek to emulate the behavior of a target device, such as a cache memory. Without the benefit of simulators, particularly those exhibiting behavior close to that of the target system, a device under development or testing may face design and debugging challenges. Such challenges are potentially more difficult to overcome without undergoing multiple and oftentimes unnecessary iterative work—an expensive and time-consuming endeavor.

Current cache memory simulators use random read and write requests to the cache memory whose behavior they seek to emulate. Random requests fail to emulate a real-world environment typically experienced by a cache memory and, therefore, are not an accurate emulation of the in-field environment to which the cache memory is often exposed. Imprecise emulation of a target device, such as cache memory, is a reflection of a simulator's unreliability leading to potentially costly redesigns.

SUMMARY

In general, in one aspect, the invention relates to a method for performing calibrating a simulator instance. The method includes receiving, by a workload generator, a trace file specifying operations; generating, by the workload generator a workload based on the operations, wherein the workload includes one or more read or write requests corresponding to the operations of the workload; receiving, by the simulator instance, the read or write requests from the workload generator; and processing, by the simulator instance, the read or write requests based on a set of simulation parameters to generate simulation results, wherein the simulation instance is calibrated, at least in part, based on the simulation results.

In general, in one aspect, the invention relates to a device including a processor and memory comprising instructions which, when executed by the processor, perform calibrating a simulator instance by receiving, by a workload generator, a trace file specifying operations; generating, by the workload generator a workload based on the operations, wherein the workload includes one or more read or write requests corresponding to the operations of the workload; receiving, by the simulator instance, the read or write requests from the workload generator; and processing, by the simulator instance, the read or write requests based on a set of simulation parameters to generate simulation results, wherein the simulation instance is calibrated, at least in part, based on the simulation results.

In general, in one aspect, the invention relates to the invention relates to a non-transitory computer readable medium comprising computer readable program code, which when executed by a computer processor enables the computer processor to perform a method for performing calibrating a simulator instance. The method includes receiving, by a workload generator, a trace file specifying operations; generating, by the workload generator a workload based on the operations, wherein the workload includes one or more read or write requests corresponding to the operations of the workload; receiving, by the simulator instance, the read or write requests from the workload generator; and processing, by the simulator instance, the read or write requests based on a set of simulation parameters to generate simulation results, wherein the simulation instance is calibrated, at least in part, based on the simulation results.

BRIEF DESCRIPTION OF DRAWINGS

FIGS. 6-11 show examples in accordance with one or more embodiments of the invention.

DETAILED DESCRIPTION

Figure 1:
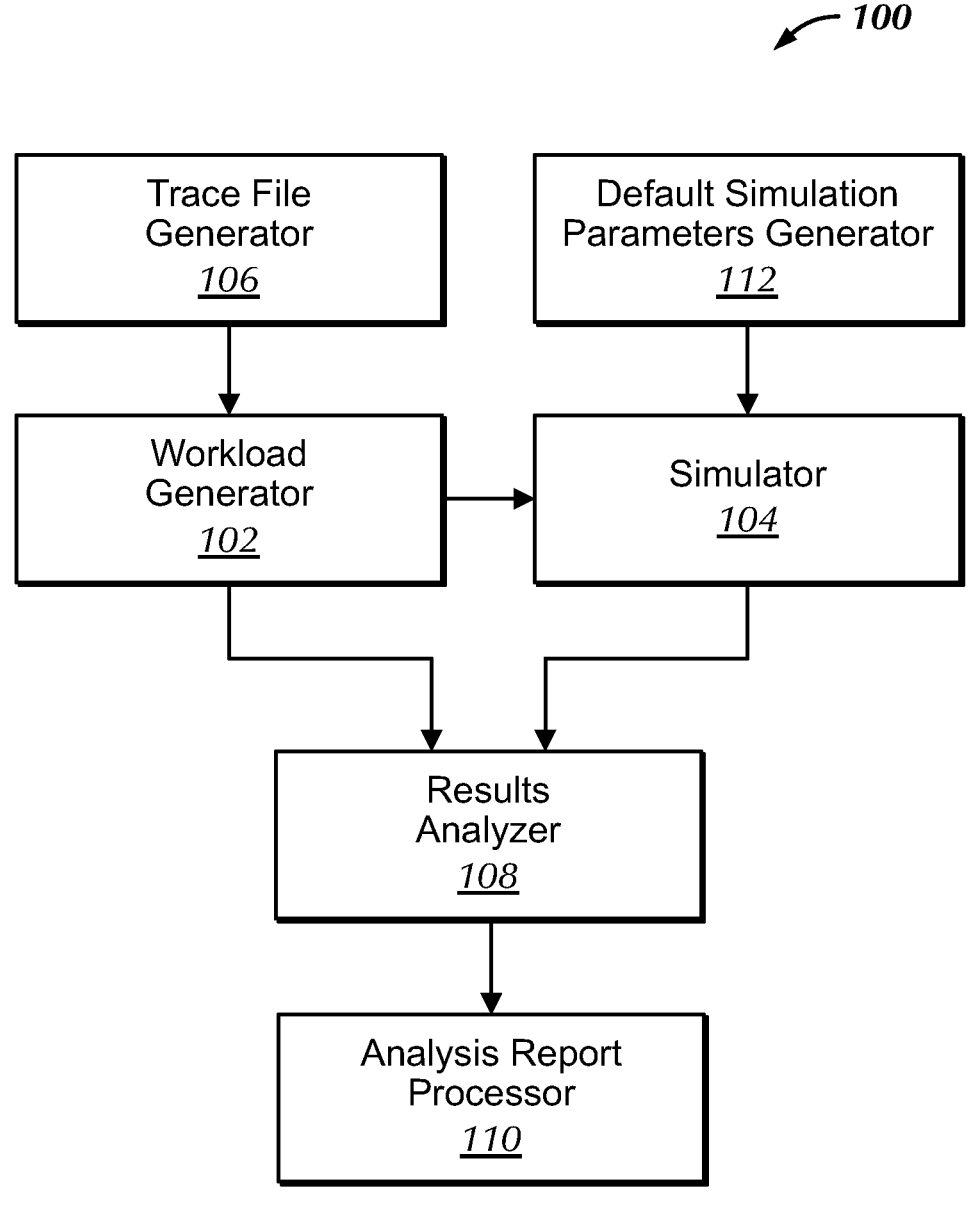
FIG. 1 shows an example system in accordance with one or more embodiments of the invention described herein.

Specific embodiments of the invention will now be described in detail with reference to the accompanying figures. In the following detailed description of the embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention are directed to calibrating a simulator emulating the operation of a target device, such as a cache memory, for increased simulation reliability. Embodiments of the invention are further directed to a monitoring system executing an agent of a simulator for monitoring the behavior of the system with a set of parameters while the system is in an in-field environment. The agent detects underperformance of one or more aspects of the system to enable implementing a more desirable set of parameters to improve the behavior of the system.

More specifically, rather than emulating the operation of a target device with random input and output, a simulator may receive input specifically tailored to the product undergoing testing. In simulating a cache memory, a pre-generated and pre-configured workload, reflecting a series of requests from a real-life data stream of input and output signals, may be provided as input to the simulator. The data stream is a series of requests, such as read and write requests to memory, associated with input and output operations performed by a system. For example, a cache memory, in a storage system, may be employed to service requests for incoming data to the storage system through various ports and outgoing data from the storage system through the same or other ports. A workload may be derived from a trace file, presenting a selective practical test scenario that may be of particular interest to a designer of a product to test an aspect of the product design before the product is finalized, used to calibrate a simulator of a device under test, or used to simulate a device under various conditions in an effort to arrive at the most favorable conditions for device development.

In a cache memory-based system, a workload may be provided to the simulator by a workload generator that generates the workload by processing a trace file based on a data stream collected in-field, while the system was operational. The workload may be a file of a known series of read and write requests applied to the simulator for emulation of the cache memory.

The workload generator also develops an expected set of results reflecting outcomes expected to be generated by the simulator when the simulator operates reliably, precisely emulating the cache memory and processing the workload requests as expected. The expected results from the workload generator are compared to the simulation results, generated by the simulator based on the processing of the workload requests from the workload generator. In response to a match of the expected results the simulation results, the simulator may be deemed reliable, otherwise, in response to a mismatch of the expected results and the simulation results, the simulation may be deemed unreliable. The result of the comparison between the workload generator expected results and the simulator results may be utilized for other purposes, some of which are discussed below and others of which are contemplated.

In addition to the workload, in some cases, a set of parameters may be input to the simulator. The parameters may be programmably or manually entered and represent attributes of the device under test to allow for testing of the device under various conditions. The parameters may be selected to target testing certain functions of the device under test. For example, when simulating a cache memory, the size of the cache memory (e.g., 10 Megabytes (Mb), 1 Gigabytes (Gb)) and the type of cache memory (e.g., static random access memory (SRAM), Flash memory) may be a part of the parameters provided to the simulator to test the behavior of the cache memory under different scenarios for improved system design development.

In some cases, the simulator may be downloaded to a developer's product under test where an instance of the simulator, an agent, may be executed while the product undergoing development or testing operates in a real-world, practical setting. In this manner, the simulator may emulate the device or aspects of the device and generate results expected from the device when the device operates properly. The results generated by the device may be compared to the simulator results for an assessment of the integrity of the device design and testing. Testing with the simulator instance may be done locally, while the simulator instance resides in the developer's system, at the developers' site, to avoid remote transfers of sensitive files therefore avoiding the possibility of security breach.

An example of a cache simulation framework may include a workload generated by a workload generator based on a trace file of a series of cache memory read and write requests. Along with the workload, the workload generator creates a file of a series of expected results anticipated by a reliable simulator. The expected results from the workload generator include information relating to the outcome of each of the read or write requests in the workload. For example, an expected result may be a cache hit or a cache miss corresponding to a read request in the workload, another expected result may be a cache promotion corresponding to the same or another read request in the workload, and so on. Each of the workload generator expected results and each of the simulation results may have a common identification, i.e., record identification, for ease of matching the outcome of a request at a particular address in the expected results and the simulation results.

The simulator receives the workload, a series of suggested requests, from the workload generator and processes the suggested requests. For example, where the simulator detects a read request, the simulator emulates a read operation of a specified location in an address space at least partially known to a cache memory and where the simulator detects a write request, the simulator emulates a write operation to a specified location in an address space at least partially known to a cache memory. The simulator generates a file of simulator results including a series of cache hits, cache misses, and other cache-related results, based on the requests from the workload. The output of the simulator is compared to the expected results from the workload generator for assessment, such as calibration of the simulator, design development, or best parameter selection. For example, the result of the comparison may be utilized to fine tune cache policies (e.g., pre-fetch and promotion), determine the best cache size and cache type or test the reliability of the simulator.

Various embodiments of the invention are described below.

FIG. 1 illustrates an exemplary simulation system (100), according to one or more embodiments of the invention. As shown in FIG. 1, the simulation system (100) includes a trace file generator (106), a workload generator (102), a simulator (104), a results analyzer (108), a default simulation parameter generator (112), and an analysis report processor (110). In one or more embodiments of the invention, each of the aforementioned components may communicate using any combination of wired and/or wireless communication technology. Each of the aforementioned components is described below.

In an embodiment of the invention, the workload generator (102) may be implemented using one or more computing devices (see e.g., FIG. 12) functionally equipped to receive and process a trace file received from the trace file generator (106), and, based on the trace file, generate a set of expected results and a workload for input to the simulator (104). For example, trace file may include a list of operations (e.g., read and write requests) performed by a cache-based system that is to be simulated. The workload generator (102) may expand one or more of the operations, infer one or more operations, and/or filter one or more of the operations, keeping certain operations and removing other operations based on one or more criteria.

In one embodiment of the invention, the workload generator (102) is a physical or virtual device that may be used for performing various embodiments of the invention. The physical device may correspond to any physical system with functionality to implement one or more embodiments of the invention. For example, the physical device may be a device or a part of or incorporated in a system with at least one or more processor(s) and memory.

Alternatively, the physical device may be a special purpose computing device that includes one or more application-specific processor(s) (or hardware) configured to only execute embodiments of the invention. In such cases, the physical device may implement embodiments of the invention in hardware as a family of circuits and may retain limited functionality to receive input and generate output in accordance with various embodiments of the invention. In addition, such computing devices may use a state-machine to implement various embodiments of the invention.

In another embodiment of the invention, the physical device may correspond to a computing device that includes one or more general purpose processor(s) and one or more application-specific processor(s) (or hardware). In such cases, one or more portions of the invention may be implemented using the operating system and general purpose processor(s), while one or more portions of the invention may be implemented using the application-specific processor(s) (or hardware).

In one embodiment of the invention, the workload generator (102) includes executable instructions (stored in a non-transitory computer readable medium (not shown), which when executed, enable the workload generator (102) to perform one or more methods described below (see e.g., FIGS. 3, 4, and 6-11).

In an embodiment of the invention, the simulator (104) may implemented using one or more computing devices (see e.g., FIG. 12) functionally equipped to receive a workload from the workload generator (102), process the workload, and generate simulator results based on the workload.

In one embodiment of the invention, the simulator (104) is a physical or virtual device that may be used for performing various embodiments of the invention. The physical device may correspond to any physical system with functionality to implement one or more embodiments of the invention. For example, the physical device may be a device or a part of or incorporated in a system with at least one or more processor(s) and memory.

Alternatively, the physical device may be a special purpose computing device that includes one or more application-specific processor(s) (or hardware) configured to only execute embodiments of the invention. In such cases, the physical device may implement embodiments of the invention in hardware as a family of circuits and may retain limited functionality to receive input and generate output in accordance with various embodiments of the invention. In addition, such computing devices may use a state-machine to implement various embodiments of the invention.

In another embodiment of the invention, the physical device may correspond to a computing device that includes one or more general purpose processor(s) and one or more application-specific processor(s) (or hardware). In such cases, one or more portions of the invention may be implemented using the operating system and general purpose processor(s), while one or more portions of the invention may be implemented using the application-specific processor(s) (or hardware).

In one embodiment of the invention, the simulator (104) includes executable instructions (stored in a non-transitory computer readable medium (not shown)), which when executed, enable the simulator (104) to perform one or more methods described below (see e.g., FIGS. 3, 4, and 6-11). In the discussions to follow, the simulator (104) is presumed to be an instance or agent of the simulator (104).

In an embodiment of the invention, the trace file generator (106) may be implemented using one or more computing devices (see e.g., FIG. 12) functionally equipped to receive a data stream of serial input and output operations, generate a trace file based on the data stream and provide the trace file to the workload generator (102).

In one embodiment of the invention, the trace file generator (106) is a physical or virtual device that may be used for performing various embodiments of the invention. The physical device may correspond to any physical system with functionality to implement one or more embodiments of the invention. For example, the physical device may be a device or a part of or incorporated in a system with at least one or more processor(s) and memory.

Alternatively, the physical device may be a special purpose computing device that includes one or more application-specific processor(s) (or hardware) configured to only execute embodiments of the invention. In such cases, the physical device may implement embodiments of the invention in hardware as a family of circuits and may retain limited functionality to receive input and generate output in accordance with various embodiments of the invention. In addition, such computing devices may use a state-machine to implement various embodiments of the invention.

In another embodiment of the invention, the physical device may correspond to a computing device that includes one or more general purpose processor(s) and one or more application-specific processor(s) (or hardware). In such cases, one or more portions of the invention may be implemented using the operating system and general purpose processor(s), while one or more portions of the invention may be implemented using the application-specific processor(s) (or hardware).

In one embodiment of the invention, the trace file generator (106) includes executable instructions (stored in a non-transitory computer readable medium (not shown)), which when executed, enable the trace file generator (106) to perform one or more methods described below (see e.g., FIGS. 3, 4, 5, and 6-11).

In an embodiment of the invention, the results analyzer (108) may be implemented using one or more computing devices (see e.g., FIG. 12) functionally equipped to receive expected results from the workload generator (102) and simulator results from the simulator (104), compare the expected results and the simulator results, and provide the result of the comparison to the analysis report processor (110).

In one embodiment of the invention, the results analyzer (108) is a physical or virtual device that may be used for performing various embodiments of the invention. The physical device may correspond to any physical system with functionality to implement one or more embodiments of the invention. For example, the physical device may be a device or a part of or incorporated in a system with at least one or more processor(s) and memory.

Alternatively, the physical device may be a special purpose computing device that includes one or more application-specific processor(s) (or hardware) configured to only execute embodiments of the invention. In such cases, the physical device may implement embodiments of the invention in hardware as a family of circuits and may retain limited functionality to receive input and generate output in accordance with various embodiments of the invention. In addition, such computing devices may use a state-machine to implement various embodiments of the invention.

In another embodiment of the invention, the physical device may correspond to a computing device that includes one or more general purpose processor(s) and one or more application-specific processor(s) (or hardware). In such cases, one or more portions of the invention may be implemented using the operating system and general purpose processor(s), while one or more portions of the invention may be implemented using the application-specific processor(s) (or hardware).

In one embodiment of the invention, the results analyzer (108) includes executable instructions (stored in a non-transitory computer readable medium (not shown)), which when executed, enable the results analyzer (108) to perform one or more methods described below (see e.g., FIGS. 3, 4, 5, and 6-11).

In an embodiment of the invention, the analysis report processor (110) may be implemented using one or more computing devices (see e.g., FIG. 12) functionally equipped to receive the results of a comparison between expected results and simulation results from the results analyzer (108) and to process the results of the comparison to generate a comparison report for analysis and assessment.

In one embodiment of the invention, the analysis report processor (110) is a physical or virtual device that may be used for performing various embodiments of the invention. The physical device may correspond to any physical system with functionality to implement one or more embodiments of the invention. For example, the physical device may be a device or a part of or incorporated in a system with at least one or more processor(s) and memory.

Alternatively, the physical device may be a special purpose computing device that includes one or more application-specific processor(s) (or hardware) configured to only execute embodiments of the invention. In such cases, the physical device may implement embodiments of the invention in hardware as a family of circuits and may retain limited functionality to receive input and generate output in accordance with various embodiments of the invention. In addition, such computing devices may use a state-machine to implement various embodiments of the invention.

In another embodiment of the invention, the physical device may correspond to a computing device that includes one or more general purpose processor(s) and one or more application-specific processor(s) (or hardware). In such cases, one or more portions of the invention may be implemented using the operating system and general purpose processor(s), while one or more portions of the invention may be implemented using the application-specific processor(s) (or hardware).

In one embodiment of the invention, the analysis report processor (110) includes executable instructions (stored in a non-transitory computer readable medium (not shown)), which when executed, enable the analysis report processor (110) to perform one or more methods described below (see e.g., FIGS. 3, 4, 5, and 6-11).

In an embodiment of the invention, the default simulation parameters generator (112) may be implemented using one or more computing devices (see e.g., FIG. 12) functionally equipped to generate, manually or programmably, one or more simulation parameters and provide the simulation parameters to the simulator (104) for use in simulating a target device (e.g., a cache memory).

In one embodiment of the invention, the default simulation parameters generator (112) is a physical or virtual device that may be used for performing various embodiments of the invention. The physical device may correspond to any physical system with functionality to implement one or more embodiments of the invention. For example, the physical device may be a device or a part of or incorporated in a system with at least one or more processor(s) and memory.

Alternatively, the physical device may be a special purpose computing device that includes one or more application-specific processor(s) (or hardware) configured to only execute embodiments of the invention. In such cases, the physical device may implement embodiments of the invention in hardware as a family of circuits and may retain limited functionality to receive input and generate output in accordance with various embodiments of the invention. In addition, such computing devices may use a state-machine to implement various embodiments of the invention.

In another embodiment of the invention, the physical device may correspond to a computing device that includes one or more general purpose processor(s) and one or more application-specific processor(s) (or hardware). In such cases, one or more portions of the invention may be implemented using the operating system and general purpose processor(s), while one or more portions of the invention may be implemented using the application-specific processor(s) (or hardware).

In one embodiment of the invention, the default simulation parameters generator (112) includes executable instructions (stored in a non-transitory computer readable medium (not shown)), which when executed, enable the default simulation parameters generator (112) to perform one or more methods described below (see e.g., FIGS. 3, 4, 5, and 6-11).

Figure 2:
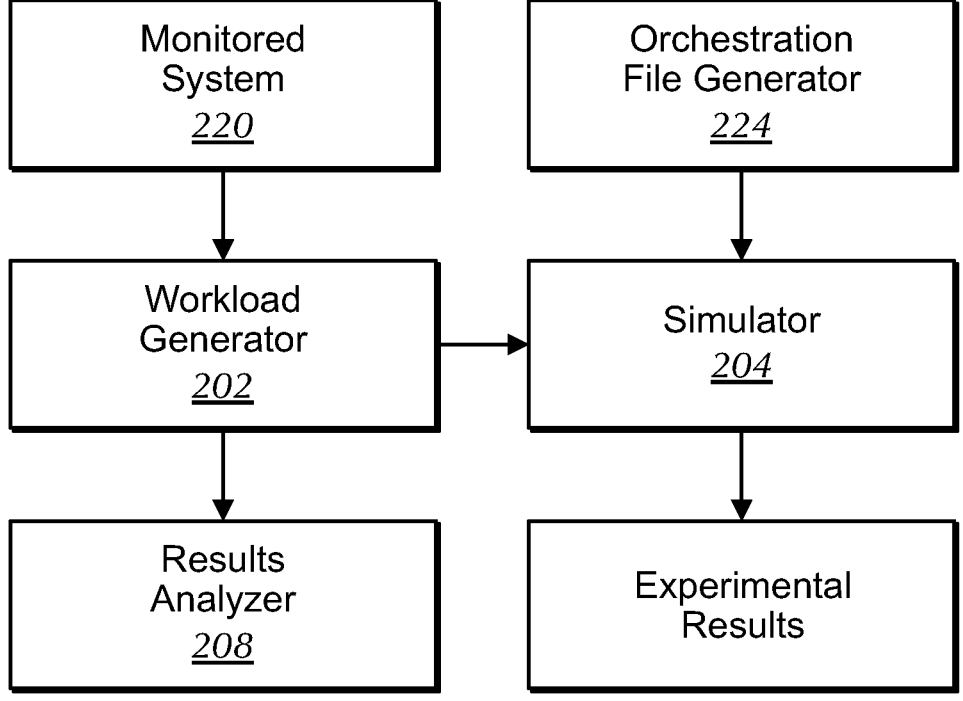
FIG. 2 shows another example system in accordance with one or more embodiments of the invention described herein.

FIG. 2 illustrates an exemplary simulation system (200), according to one or more embodiments of the invention. As shown in FIG. 2, the simulation system (200) includes a monitored system (220), a workload generator (202), a simulator (204), a results analyzer (208), and an orchestration file generator (224). In one or more embodiments of the invention, each of the aforementioned components may communicate using any combination of wired and/or wireless communication technology. Each of the aforementioned components is described below. In an embodiment of the invention, an instance of agent of a calibrated simulator corresponding to system (100), FIG. 1, may be employed in the simulation system (200) to detect underperformance of one or more aspects of the system while the system is operating in-field with a set of parameters. In response to detection of the underperformance, the behavior of system (200) may be improved based on a more desirable set of parameters.

In an embodiment of the invention, the workload generator (202) may be configured as the workload generator (102) of FIG. 1 with certain exceptions as discussed below. In some embodiments, the workload generator (202) is not necessarily configured as the workload generator (102) of FIG. 1. In an embodiment of the invention, the workload generator (202) may be implemented using one or more computing devices (see e.g., FIG. 12) functionally equipped to receive and process a trace file from the monitored system (220), and, based on the trace file, generate a set of expected results and a workload for input to the simulator (204).

In one embodiment of the invention, the workload generator (202) is a physical or virtual device that may be used for performing various embodiments of the invention. The physical device may correspond to any physical system with functionality to implement one or more embodiments of the invention. For example, the physical device may be a device or a part of or incorporated in a system with at least one or more processor(s) and memory.

Alternatively, the physical device may be a special purpose computing device that includes one or more application-specific processor(s) (or hardware) configured to only execute embodiments of the invention. In such cases, the physical device may implement embodiments of the invention in hardware as a family of circuits and may retain limited functionality to receive input and generate output in accordance with various embodiments of the invention. In addition, such computing devices may use a state-machine to implement various embodiments of the invention.

In another embodiment of the invention, the physical device may correspond to a computing device that includes one or more general purpose processor(s) and one or more application-specific processor(s) (or hardware). In such cases, one or more portions of the invention may be implemented using the operating system and general purpose processor(s), while one or more portions of the invention may be implemented using the application-specific processor(s) (or hardware).

In one embodiment of the invention, the workload generator (202) includes executable instructions (stored in a non-transitory computer readable medium (not shown), which when executed, enable the workload generator (202) to perform one or more methods described below (see e.g., FIGS. 5 and 6-11).

In an embodiment of the invention, the simulator (204) may be implemented using one or more computing devices (see e.g., FIG. 12) functionally equipped to receive a workload from the workload generator (202), process the workload, and generate experimental results, and in some cases to process the workload based on distinct combinations of sets of performance metrics from an orchestration file obtained from the orchestration file generator (224) for best performance assessment.

In one embodiment of the invention, the simulator (204) is a physical or virtual device that may be used for performing various embodiments of the invention. The physical device may correspond to any physical system with functionality to implement one or more embodiments of the invention. For example, the physical device may be a device or a part of or incorporated in a system with at least one or more processor(s) and memory.

Alternatively, the physical device may be a special purpose computing device that includes one or more application-specific processor(s) (or hardware) configured to only execute embodiments of the invention. In such cases, the physical device may implement embodiments of the invention in hardware as a family of circuits and may retain limited functionality to receive input and generate output in accordance with various embodiments of the invention. In addition, such computing devices may use a state-machine to implement various embodiments of the invention.

In another embodiment of the invention, the physical device may correspond to a computing device that includes one or more general purpose processor(s) and one or more application-specific processor(s) (or hardware). In such cases, one or more portions of the invention may be implemented using the operating system and general purpose processor(s), while one or more portions of the invention may be implemented using the application-specific processor(s) (or hardware).

In one embodiment of the invention, the simulator (204) includes executable instructions (stored in a non-transitory computer readable medium (not shown)), which when executed, enable the simulator (204) to perform one or more methods described below (see e.g., FIGS. 5 and 6-11). In the discussions to follow, the simulator (204) is presumed to be an instance of the simulator (204).

In an embodiment of the invention, the monitored system (220) may be implemented using one or more computing devices (see e.g., FIG. 12) functionally equipped to monitor the system performance of a system under test and based on the monitored system performance, determine to generate and provide to the workload generator (202), a trace file for a specific time interval.

In one embodiment of the invention, the monitored system (220) is a physical or virtual device that may be used for performing various embodiments of the invention. The physical device may correspond to any physical system with functionality to implement one or more embodiments of the invention. For example, the physical device may be a device or a part of or incorporated in a system with at least one or more processor(s) and memory.

Alternatively, the physical device may be a special purpose computing device that includes one or more application-specific processor(s) (or hardware) configured to only execute embodiments of the invention. In such cases, the physical device may implement embodiments of the invention in hardware as a family of circuits and may retain limited functionality to receive input and generate output in accordance with various embodiments of the invention. In addition, such computing devices may use a state-machine to implement various embodiments of the invention.

In another embodiment of the invention, the physical device may correspond to a computing device that includes one or more general purpose processor(s) and one or more application-specific processor(s) (or hardware). In such cases, one or more portions of the invention may be implemented using the operating system and general purpose processor(s), while one or more portions of the invention may be implemented using the application-specific processor(s) (or hardware).

In one embodiment of the invention, the monitored system (220) includes executable instructions (stored in a non-transitory computer readable medium (not shown)), which when executed, enable the trace file generator (106) to perform one or more methods described below (see e.g., FIGS. 3, 4, and 6-11).

In an embodiment of the invention, the results analyzer (208) may be implemented using one or more computing devices (see e.g., FIG. 12) functionally equipped to receive expected results from the workload generator (202) for comparison of distinct expected results based on a distinct combination of performance metrics.

In one embodiment of the invention, the results analyzer (208) is a physical or virtual device that may be used for performing various embodiments of the invention. The physical device may correspond to any physical system with functionality to implement one or more embodiments of the invention. For example, the physical device may be a device or a part of or incorporated in a system with at least one or more processor(s) and memory.

Alternatively, the physical device may be a special purpose computing device that includes one or more application-specific processor(s) (or hardware) configured to only execute embodiments of the invention. In such cases, the physical device may implement embodiments of the invention in hardware as a family of circuits and may retain limited functionality to receive input and generate output in accordance with various embodiments of the invention. In addition, such computing devices may use a state-machine to implement various embodiments of the invention.

In another embodiment of the invention, the physical device may correspond to a computing device that includes one or more general purpose processor(s) and one or more application-specific processor(s) (or hardware). In such cases, one or more portions of the invention may be implemented using the operating system and general purpose processor(s), while one or more portions of the invention may be implemented using the application-specific processor(s) (or hardware).

In one embodiment of the invention, the results analyzer (208) includes executable instructions (stored in a non-transitory computer readable medium (not shown)), which when executed, enable the results analyzer (208) to perform one or more methods described below (see e.g., FIGS. 5 and 6-11).

In an embodiment of the invention, the orchestration file generator (224) may be implemented using one or more computing devices (see e.g., FIG. 12) functionally equipped to generate, manually or programmably, one or more sets of performance metrics (e.g., in the form of an orchestration file) and provide the one or more sets of performance metrics to the simulator (204) for obtaining experimental results.

In one embodiment of the invention, the orchestration file generator (224) is a physical or virtual device that may be used for performing various embodiments of the invention. The physical device may correspond to any physical system with functionality to implement one or more embodiments of the invention. For example, the physical device may be a device or a part of or incorporated in a system with at least one or more processor(s) and memory.

Alternatively, the physical device may be a special purpose computing device that includes one or more application-specific processor(s) (or hardware) configured to only execute embodiments of the invention. In such cases, the physical device may implement embodiments of the invention in hardware as a family of circuits and may retain limited functionality to receive input and generate output in accordance with various embodiments of the invention. In addition, such computing devices may use a state-machine to implement various embodiments of the invention.

In another embodiment of the invention, the physical device may correspond to a computing device that includes one or more general purpose processor(s) and one or more application-specific processor(s) (or hardware). In such cases, one or more portions of the invention may be implemented using the operating system and general purpose processor(s), while one or more portions of the invention may be implemented using the application-specific processor(s) (or hardware).

In one embodiment of the invention, the orchestration file generator (224) includes executable instructions (stored in a non-transitory computer readable medium (not shown)), which when executed, enable the orchestration file generator (224) to perform one or more methods described below (see e.g., FIGS. 5 and 6-11).

Figure 3:
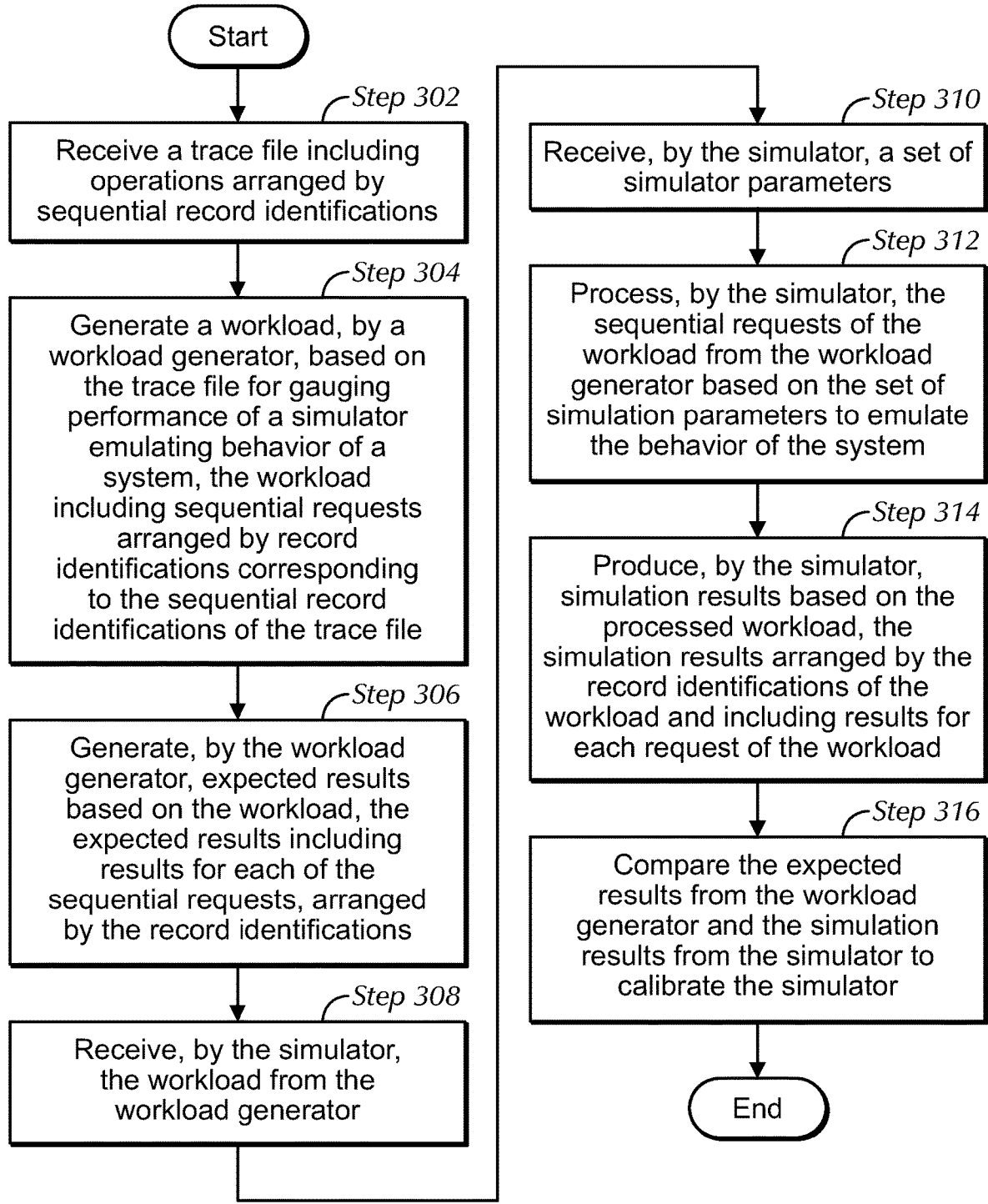
FIG. 3 shows a flowchart describing a method for calibrating a simulator in accordance with one or more embodiments of the invention disclosed herein.

FIG. 3 shows a flowchart describing a method for calibrating a simulator in accordance with one or more embodiments described herein. The method of FIG. 3 may be performed by, for example, by the simulation system (100) of FIG. 1. Other components not illustrated in FIG. 1 may perform or assist in performing the method of FIG. 3 without departing from the invention.

While the various steps in the flowchart shown in FIG. 3 are presented and described sequentially, one of ordinary skill in the relevant art, having the benefit of this Detailed Description, will appreciate that some or all of the steps may be executed in different orders, that some or all of the steps may be combined or omitted, and/or that some or all of the steps may be executed in parallel.

In step 302, a trace file is received from a trace file generator (e.g., (106), FIG. 1) that includes one or more operations arranged in a sequential order based on corresponding record identifications. The operations may be based on the type of system undergoing simulation by a simulator (e.g., (104), FIG. 1). For example, when simulating a cache memory, the operations of the trace file may include a set of read and write requests to the cache memory that are arranged in sequential order of corresponding record identifications (e.g., sequential ascending order). For the purpose of illustration only, the discussion to follow of the flowchart of FIG. 3 is presumed to pertain to simulation of a cache memory with a trace file including one or more read and write requests. The trace file may be received by a workload generator (e.g., (102), FIG. 1) from a trace file generator (e.g., (106), FIG. 1).

In step 304, a workload generator (e.g., (102), FIG. 1) generates a workload based on the trace file for gauging the performance of the cache memory simulator emulating the behavior of the cache memory. The workload includes a set of requests arranged in sequential order based on corresponding record identifications that correspond to the sequentially ordered record identifications of the trace file of step 302. The workload generator provides the workload to the cache memory simulator.

In step 306, the workload generator further generates expected results for each of the sequential requests of the trace file based on the workload from the workload generator. The expected results are arranged in the sequential order of the records identifications of the record identifications of the workload. In some embodiments, the workload generator may generate the expected results simultaneously with the workload. In some embodiments, the workload generator may generate the expected results after generating the workload. The workload generator provides the expected results to a results analyzer (e.g., (108), FIG. 1) for comparison with simulator results generated by a simulator (e.g., (104) FIG. 1).

In step 308, the simulator receives the workload from the workload generator. The simulator may additionally receive a set of simulator parameters from a default simulation parameter generator (e.g., (112), FIG. 1) for simulation of the cache memory with controlled parameters, in step 310. For example, the simulator may receive the cache memory type, the cache memory size, and other cache memory-related attributes from the default simulation parameter generator. In some embodiments, the simulator receives the simulator parameters from the default simulation parameter generator simultaneously with receiving the workload from the workload generator. In some embodiments, the simulator receives the simulator parameters from the default simulation parameter generator before or after receiving the workload from the workload generator.

The behavior of the cache memory with such attributes can be compared against the behavior of the cache memory with other attributes, during a separate simulation, to help fine tune the design of the cache memory. Alternatively, or additionally, the parameters may be altered for purposes other than gauging the performance of the cache memory with distinct parameters, as earlier discussed.

In step 312, the simulator (e.g., (104), FIG. 1) processes the sequential requests of the workload based on the set of simulation parameters of step 310, emulating the behavior of the cache memory using the set of simulation parameters. For example, when encountering a read request to the cache memory, the simulator emulates a read operation to the cache memory with parameters dictated by the set of parameters.

In step 314, for each request and based on the processed workload, the simulator produces simulation results arranged in the sequential order of the record identifications of the requests of the workload from the workload generator.

In step 316, a results analyzer (e.g., (108), FIG. 1) compares the expected results (step 306) from the workload generator and the simulation results from the simulator (step 314) and provides the results of the comparison to an analysis report processor (e.g., (110), FIG. 1). The analysis report processor may produce a report of the comparison results that may be used to calibrate the simulator, fine tune the design of the cache memory with use of various sets of simulation parameters, or for other suitable purposes. For example, cache policies (e.g., prefetch, promotion) may be devised based on the comparison results of the report. The process ends after step 316.

Figure 4:
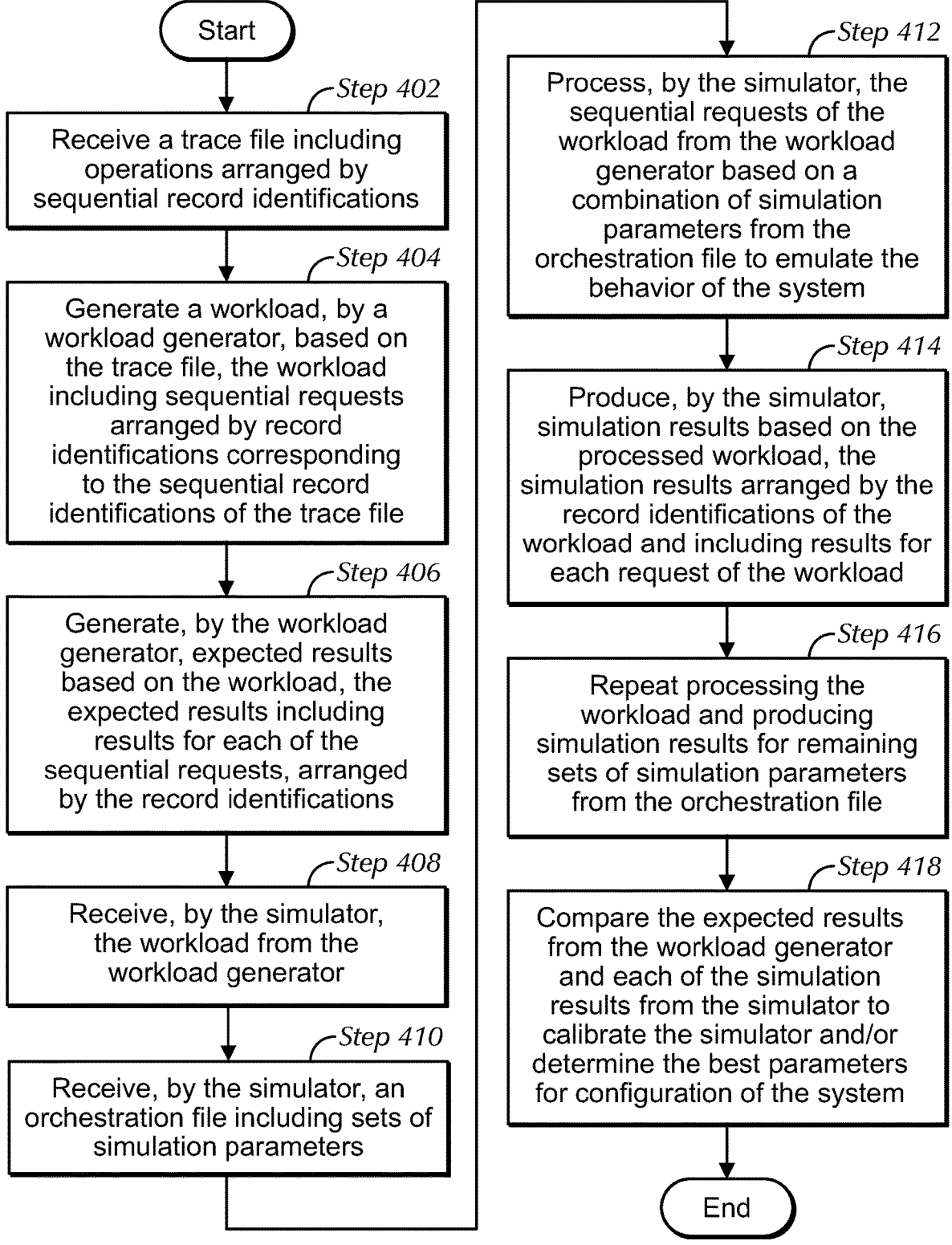
FIG. 4 shows a flowchart describing a method for calibrating a simulator or determining the best parameters for configuring a system in accordance with one or more embodiments of the invention disclosed herein.

FIG. 4 shows a flowchart describing a method for calibrating a simulator or determining the best parameters for configuring a system in accordance with one or more embodiments described herein. The method of FIG. 4 may be performed by, for example, simulation system (100) of FIG. 1). Other components not illustrated in FIG. 1 may perform or assist in performing the method of FIG. 4 without departing from the invention.

While the various steps in the flowchart shown in FIG. 4 are presented and described sequentially, one of ordinary skill in the relevant art, having the benefit of this Detailed Description, will appreciate that some or all of the steps may be executed in different orders, that some or all of the steps may be combined or omitted, and/or that some or all of the steps may be executed in parallel.

In step 402, a trace file is received from a trace file generator (e.g., (106), FIG. 1) including one or more operations arranged in a sequential order based on corresponding record identifications, as discussed above. The operations may be based on the type of system undergoing simulation by a simulator (e.g., (104), FIG. 1). For example, when simulating a cache memory, the operations of the trace file may include a set of read and write requests to the cache memory that are arranged in sequential order of their corresponding record identifications. For the purpose of illustration only, the discussion to follow of the flow chart of FIG. 4 is presumed to pertain to simulation of a cache memory with a trace file including one or more read and write requests. The trace file may be received by a workload generator (e.g., (102), FIG. 1).

In step 404, a workload generator (e.g., (102), FIG. 1) generates a workload based on the trace file. The workload includes a set of requests arranged in sequential order based on corresponding record identifications that correspond to the sequential record identifications of the trace file of step 402. The workload generator provides the workload to a cache memory simulator (e.g., (104), FIG. 1).

In step 406, a workload generator (e.g., (102), FIG. 1) generates expected results for each of the sequential requests of the trace file based on the workload from the workload generator. The expected results are arranged in the sequential order of the records identifications of the workload. The workload generator provides the expected results to a results analyzer (e.g., (108), FIG. 1) for comparison with simulator results.

In step 408, the simulator receives the workload from the workload generator. The simulator may additionally receive a set of simulator parameters, in step 410, from a default simulation parameter generator (e.g., (112), FIG. 1) for simulation of the cache memory using controlled parameters. For example, the simulator may receive the cache memory type, the cache memory size, and other cache memory-related attributes. The behavior of the cache memory with a known set of attributes can be compared against the behavior of the cache memory with one or more other known sets of attributes to calibrate the simulator or fine tune the design of the cache memory based on the best set of simulation parameters. Alternatively, or additionally, the parameters may be altered for purposes other than gauging the performance of the cache memory with distinct parameters.

In step 412, the simulator (e.g., (104), FIG. 1) processes the sequential requests of the workload based on the set of simulation parameters of step 410, emulating the behavior of the cache memory. For example, when encountering a read request to the cache memory, the simulator emulates a read operation to the cache memory.

In step 414, for each request and based on the processed workload, the simulator produces simulation results arranged in the sequential order of the record identifications of the workload from the workload generator.

In step 416, the workload is processed by the simulator for each set of simulation parameters and for each processed workload, the simulator produces simulation results to a results analyzer (e.g., (108), FIG. 1). The simulator may process the workload for each set of simulation parameters by repeating steps 412 and 412. For example, a first set of parameters may be loaded from a default simulation parameter generator (e.g., (112), FIG. 1) and the simulator may emulate read and write requests to a cache memory, at step 412, and produce the simulation results based on the first set of parameters to a results analyzer at step 414. Next, a second set of parameters may be loaded from the default simulation parameter generator and the simulator may emulate read and write requests to a cache memory, at step 412, and produce the simulation results based on the second set of parameters to a results analyzer at step 414. Similarly, the simulator may repeat steps 412 and 414 for each remaining set of parameters.

In step 418, a results analyzer (e.g., (108), FIG. 1) compares the expected results (step 406) from the workload generator and each set of simulation results based on a distinct set of parameters from the simulator (step 414) and provides the results of the comparison to an analysis report processor (e.g., (110), FIG. 1). The analysis report processor may produce a report of the comparison results that may be used to calibrate the simulator, determine the best set of parameters to use for configuration of the cache memory, or for other suitable purposes. For example, cache policies (e.g., prefetch, promotion) may be devised based on the comparison results of the report. The process ends after step 418.

Figure 5:
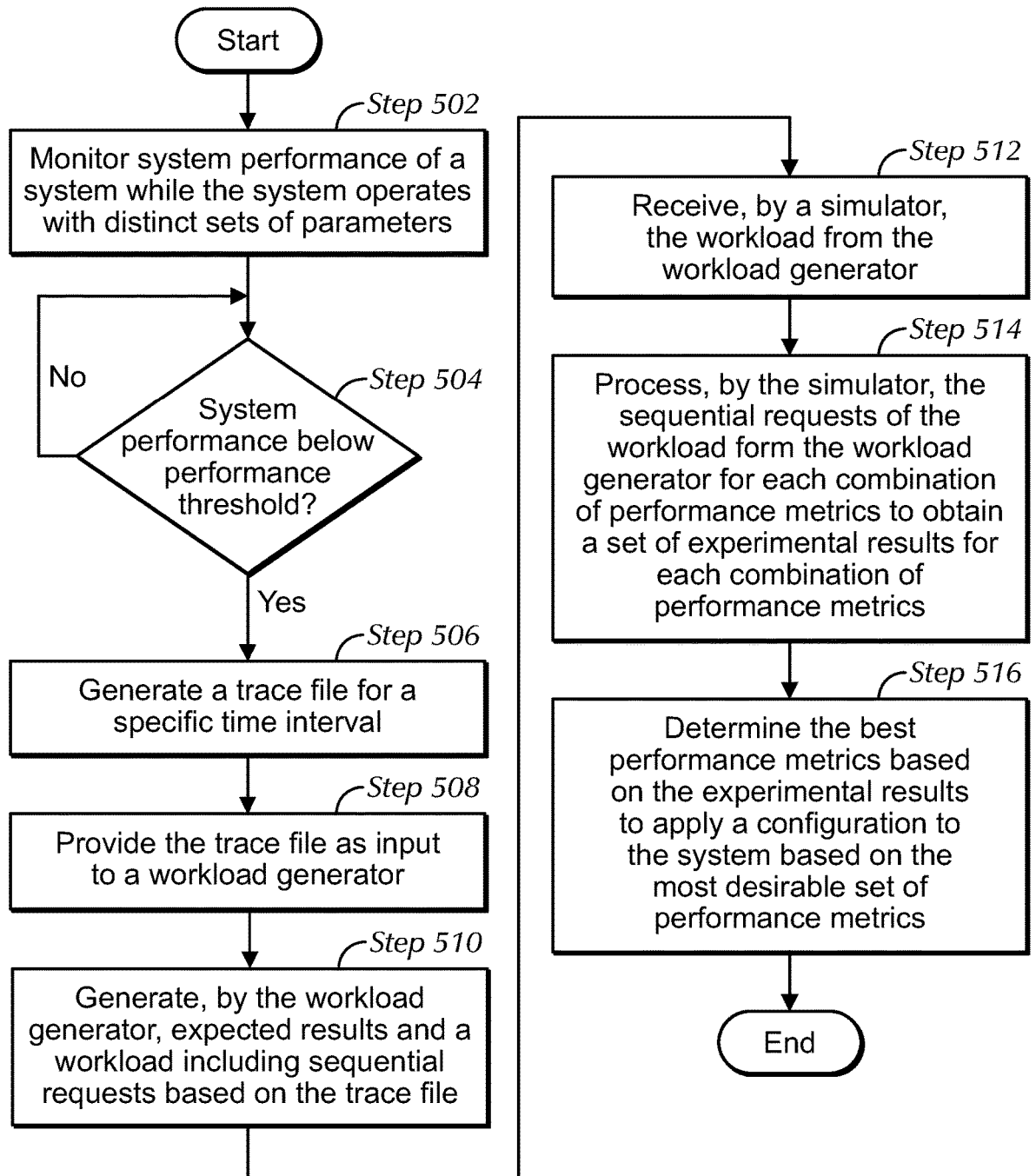
FIG. 5 shows a flowchart describing a method for determining the best set of performance metrics for configuring a system in accordance with one or more embodiments of the invention disclosed herein.

FIG. 5 shows a flowchart describing a method for determining the best set of performance metrics for configuring a system in accordance with one or more embodiments described herein. The method of FIG. 5 may be performed by, for example, the simulation system (200) of FIG. 2. Other components not illustrated in FIG. 2 may perform or assist in performing the method of FIG. 5 without departing from the invention.

While the various steps in the flowchart shown in FIG. 5 are presented and described sequentially, one of ordinary skill in the relevant art, having the benefit of this Detailed Description, will appreciate that some or all of the steps may be executed in different orders, that some or all of the steps may be combined or omitted, and/or that some or all of the steps may be executed in parallel.

In step 502, one or more aspects of the system performance of a system may be monitored by a monitored system (e.g., (220), FIG. 2).

In step 504, a determination is made as to whether the aspects of the system performance being monitored fall below a performance threshold. Continuing with the above example, for example, the monitored system may determine that the number of cache misses has fallen below an unacceptable level that would render a corresponding cache memory inefficient or ineffective. In response to a determination that the system performance has fallen below a performance threshold, the process continues to step 506, otherwise, in response to a determination that the system performance has not fallen below a performance threshold, the process repeats step 504.

In step 506, a trace file is generated by the monitored system for a specified time interval. The trace file may include one or more operations. The operations may be based on the type of system undergoing simulation by a simulator (e.g., (204), FIG. 2). For example, when simulating a cache memory, the operations of the trace file may include a set of read and write requests to the cache memory. For the purpose of illustration only, the discussion to follow of the flow chart of FIG. 5 is presumed to pertain to simulation of a cache memory with the trace file including one or more read and write requests.

In step 508, the monitored system provides the trace file as input to a workload generator (e.g., (202), FIG. 2).

In step 510, the workload generator generates a workload based on the trace file and expected results based on the workload. The workload includes a set of requests arranged in sequential order based on corresponding record identifications that correspond to the sequential record identifications of the trace file, as discussed with reference to the flow charts of FIGS. 3, 4 above. Similarly, the expected results are arranged in the sequential order of the records identifications of the workload. The workload generator provides the workload to a cache memory simulator (e.g., (204), FIG. 2).

In step 512, the simulator receives the workload from the workload generator. The simulator may additionally receive a set of simulator parameters, as discussed relative above relative to the flow charts of FIGS. 3, 4.

In step 514, the simulator (e.g., (204), FIG. 2) processes the sequential requests of the workload for each combination of performance metrics to obtain a set of experimental results for each combination of performance metrics. The simulator may process the sequential requests for each combination of performance metrics provided to the simulator by an orchestration file generator (e.g., (224), FIG. 2). The orchestration file generator provides, to the simulator, a combination of performance metrics that may be manually or automatically programmed into a file of the combination of performance metrics. By way of example, the simulator may emulate the behavior of a cache memory based on a change to one of the attributes of the cache memory (e.g., cache size) that is a part of a first set of simulation parameters and produce a first set of experimental results based on the first set of simulation parameters. The simulator may subsequently, emulate the behavior of the cache memory based on a second set of simulation parameters including the changed attribute in addition to a change to another attribute of the first set of parameters to obtain a second set of experimental results based on the second set of simulation parameters, which differs from the first set of parameters by one attribute. The simulator may perform processing of the second set of parameters where the second set of parameters differs from the first set of parameters by more than two attributes. The simulator repeats the process for each desired combination of the set of parameters and each time, produces a corresponding set of experimental results.

In step 516, the best set of performance metrics among all desired combinations of the sets of parameters may be applied to a configuration of the system based on the corresponding set of experimental results. For example, based on the best set of performance metrics, a more effective cache policy may be devised. The process ends after step 516.

FIGS. 6-11 show examples in accordance with one or more embodiments of the invention. In the examples of FIGS. 6-11, the simulator is presumed to emulate a cache memory. In some embodiments of the invention, other types of systems may be emulated by the simulator. The examples are not intended to limit the scope of the invention.

FIG. 6 shows a non-limiting example of a fragment of a trace file 600 received by a workload generator (e.g., (102) of FIG. 1, step 302, FIG. 3) from a trace file generator (e.g., (106), FIG. 1). The trace file generator may generate the trace file fragment of FIG. 6, or an entire trace file, based on an input and output data stream. The trace file 600 includes a table of rows and columns where the columns correspond to rows that are arranged by an order of record identifications, "record_id". A row is identified by a corresponding record identification and lists, starting from the left side of the page toward the right side of the page, the time the record was collected, in "milliseconds", the number of processor cycles for each record recording, "cpu", the cache memory targeted by the corresponding request (e.g., identity of the cache in a multi-tiered cache system), "origin", the solid state drive (SSD) logical block address (LBA), "SSD lba", targeted by the request, the hard disk drive (HDD) LBA, "HDD lba", targeted by the request, the number of blocks the request affects, "blockCount", the type of request, "opcode", the field replaceable unit, "fru", and the identification of the logical unit (LUN) affected by the request, "lunid". It is understood that the trace file generated by various embodiments of the invention may have a different, fewer, or a greater number set of attributes than those listed above. Regardless, the trace file has a record identification attribute to identify the record for subsequent analysis. The record identification is generally in an ascending order (e.g., 239, 240, 244, 247, and 248), as shown in FIG. 6.

The operations of the trace file of the example of FIG. 6 are performed for a read request of a cache memory. At the first record, record ID 238, the read operation starts, next, at record ID 240, a promotion operation starts where the page being read is promoted. The page may be promoted, e.g., based on a cache memory policy, the third request of the same page is promoted according to the cache policy. The operation at record ID 244 is the start of a write operation to Flash memory; the operation at record ID 247 is the end of the write to Flash memory that was started at record ID 244; and the operation at record ID 248 is the start of an internal directory update operation. The operations of trace file 600 may be derived from an actual input and output data stream to provide a real-life and practical scenario for system assessment and for a more reliable simulation.

FIG. 7 shows a non-limiting example of a fragment of a trace file 700 received by a workload generator (e.g., (102) of FIG. 1) from a trace file generator (e.g., (106), FIG. 1). The trace file generator may generate the trace file fragment of FIG. 7, or an entire trace file, based on an input and output data stream.

The trace file 700 includes a table of rows and columns where the columns correspond to rows that are arranged by an order of record identifications, "record_id". A row is identified by a corresponding record identification and lists, starting from the left side of the page toward the right side of the page, the time the record was collected, in "milliseconds", the number of processor cycles for each record recording, "cpu", the cache memory targeted by the operation (e.g., identity of the cache in a multi-tiered cache system), "origin", the number of blocks affected by the operation, "blockCount", and the operation, "opcode". It is understood that the trace file generated by various embodiments of the invention may have a different, fewer, or a greater number set of attributes of the record than those listed above. Regardless, the trace file has a record identification attribute to identify the record for subsequent analysis. The record identification is generally in an ascending order (e.g., 239, 240, 243, . . . , and 256), as shown in FIG. 7.

In an embodiment of the invention, the trace file generator may process the read request of the trace file 600 of FIG. 6 to obtain the expanded trace file 700 of FIG. 7. For example, Read Start 722A, at record ID 239, is the start of the read operation, discussed above, and Read Finish 722B, at record ID 251, is the end of the read operation started at record ID 239. The read operation started at record ID 239 and ending at record ID 251 includes nested operations, such as, promotion and write requests. Promote Start 724A, at record ID 240, denotes the start of a promotion, and Promote Finish 724B, at record ID 250, denotes the end of the promotion. Write Flash Start 726A, at record ID 244, denotes the start of a write operation to Flash memory and Write Flash Finish 726B, at record ID 247, denotes the end of the write operation to flash memory. Some of the operations of the trace file 700 are directed to a second cache, "FBE_LUN", such as record IDs 242, 243, 245, and 246.

Figures 8, 9:
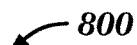

FIG. 8 shows a non-limiting example of an operation table 800 generated from a trace file with requests (e.g., (700), FIG. 7). The operation table 800 may be generated by a workload generator (e.g., (102) of FIG. 1) based on a trace file generator (e.g., (700), FIG. 7).

The operation table 800 includes a table of rows and columns where the columns correspond to rows that are arranged by an order of record identifications, "record_id". A row is identified by a corresponding record identification and lists, starting from the left side of the page toward the right side of the page, the target address of a corresponding operation, "address", the operation to be performed, "operation", the record ID of the record where the operation ends, "finish_rid", and the response time, "response_time", of the corresponding operation. It is understood that the operation table generated by various embodiments of the invention may have a different, fewer, or a greater number set of attributes of the record than those listed above. Regardless, the operation table has a record identification attribute to identify the record for subsequent analysis. The record identifications of the operation table are generally in an ascending order (e.g., 239, 240, 244, 248, and 256), as shown in FIG. 8.

A workload generator (e.g., (102), FIG. 1) may generate the operation table 800 from a trace file based on a selection of relevant operations. For example, the workload generator may keep the operations of interest for the purpose of simulation and remove all other operations. Continuing with the example of FIG. 7, the workload generator may determine that the key operations of trace file 700 are the read request, "Read", at record ID 239, the promote request, "Promote", at record ID 24, the write request, "Write Flash", at record ID 244, the internal directory update request, "Internal Dir Update", at record ID 248, and the second read request at record ID 256. The last record ID of the operation, finish_rid, is obtained from the record ID of the last opcode performed for the corresponding operation. For example, the Read request starts at record ID 239, Read Start 722A, in the trace file 700 of FIG. 7, and ends at record ID 251, Read Finish 722B. Accordingly, the finish_rid corresponding to record ID 239, in the operation table 800 of FIG. 8, is record ID 251. Similarly, the promote request, Promote Start 724A, starts at record ID 240 and ends at Promote Finish 724B, at record ID 250. Accordingly, the finish_rid corresponding to record ID 240, in the operation table 800 of FIG. 8, is record ID 250, and so on. In this respect, the operation table 800 may be considered a table of relevant start-finish operations.

Next, the workload generator may further process the list of operations by determining a parent-child relationship between the operations of the operation table 800 of FIG. 8. FIG. 9 shows a non-limiting example of an operation relationship table 900 generated from an operation table (e.g., (800), FIG. 8). The operation relationship table 900 may be generated by a workload generator (e.g., (102) of FIG. 1) based on an operation table (e.g., (800), FIG. 8).

The operation relationship table 900 includes a table of rows and columns where the columns correspond to rows that are arranged by an order of record identifications, "record_id". A row is identified by a corresponding record identification and lists, starting from the left side of the page toward the right side of the page, the target address of a corresponding operation, "address", the operation to be performed, "operation", the record ID of the record where the operation ends, "finish_rid", the response_time, "response_time", of the corresponding operation, and the parent-child relationship relative to other operations of the table 900, "parent_rid". It is understood that the operation relationship table generated by various embodiments of the invention may have a different, fewer, or a greater number set of attributes of the record than those listed above. Regardless, the operation relationship table has a record identification attribute to identify the record for subsequent analysis. The record identification is generally in an ascending order (e.g., 239, 240, 244, 248, and 256), as shown in FIG. 9.

A workload generator (e.g., (102), FIG. 1) may generate the operation relationship table 900 from an operation table by determining the parent-child relationship between the operations of the operation table. For example, continuing with the example of FIG. 8, the workload generator may determine that because the promote request, at record ID 240, and the write request, at record ID 244, are nested operations within the first read operation, starting at record ID 239, and they result from the read operation that starts at record ID 239 and moreover, they are directed to the same address, that the promote request and the write request must each be a child of the read operation encompassing the two requests. Stated differently, the read operation starting at record ID 239 is a parent of each of the promote and write operations. Accordingly, the record ID of the parent of an operation appears under parent_rid of the corresponding operation. For example, the parent ID of the promote request at record ID 240 is the record ID of the read operation at record ID 239. Accordingly, record ID 239 is noted under the column parent_rid for the record ID 240. That is, because the promote operation is nested in the first read operation and the addresses of each of the promote and read operations (1076320) are the same, the workload generator makes an inference that the promote operation results from the read operation, which may be due to a policy. For example, the read operation starting at record ID 239 may be the third time the same page, at address 1076320, is read, triggering a promotion of the page. The workload generator would not necessarily know the policy that caused the promotion but would accurately infer that the promotion must have been due to the read operation to the same page address, therefore the read operation is the parent of the promote request and marks the operation relationship in table 900 accordingly. The workload generator similarly infers that the write operation following the promote operation, at record ID 244, must have been the cause of the promotion at record ID 240. Accordingly, record ID 240 is noted under the column parent_rid for the record ID 244. The workload generator makes this inference because the write operation is to the same location as the location of the promote operation, 1076320. The only reason for a write operation immediately following a promotion operation to the same location is to write the page being promoted to the Flash, a faster memory. The workload generator infers no other discernable parent-child relationships for the first Read operation starting at record ID 239. Accordingly, no record ID is noted under the parent_rid column of the Internal Dir Update operation at record ID 248 and the second Read operation at record ID 256, in table 900.

Next, the workload generator may generate a table of expected results based on the operation relationship table 900. For example, for each record ID in table 900, the workload generator may generate a read or a write operation and any expected hits, misses, promotions, or flushes.

Figures 10, 11:
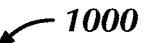

FIG. 10 shows a non-limiting example of a table of expected results 1000 generated from an operation relationship table (e.g., (900), FIG. 9) and provides the table of expected results 1000 to a results analyzer (e.g., (108), FIG. 1) for comparison with the results of the simulation and reporting. The table of expected results 1000 may be generated by a workload generator (e.g., (102) of FIG. 1) based on an operation relationship table (e.g., (900), FIG. 9).

The table of expected results 1000 includes a table of rows and columns where the columns correspond to rows that are arranged by an order of record identifications, "record_id". A row is identified by a corresponding record identification and lists, starting from the left side of the page toward the right side of the page, the number of read hits at the address of the corresponding operation, "r_hits_rba", the number of write hits at the address of the corresponding operation, "w_hits_rba", the number of read misses at the address of the corresponding operation, "r_misses_rba", the number of write misses at the address of the corresponding operation, "w_missests_rba", the number of promotion hits at the address of the corresponding operation, "promotions_hits_rba", the number of promotion misses at the address of the corresponding operation, "promotion_misses_rba", and the number of page flushes, "pages_flushed_rba". It is understood that the table of expected results generated by various embodiments of the invention may have a different, fewer, or a greater number set of attributes of the record than those listed above. Regardless, the table of expected results has a record identification attribute to identify the record for use when comparing the simulation results and the expected results. That is, for each record ID common to both results, the simulation result (e.g., number of read/write/promotion/flush hits and misses), generated by the simulator, is compared to the expected result, generated by the workload generator. The record identification is generally in an ascending order (e.g., 239, 256, 270, 280, and 292), as shown in FIG. 10.

A workload generator (e.g., (102), FIG. 1) may generate the table of expected results 1000 based on expected outcomes (e.g., reads, writes, hits, misses, promotions, flushes) when each of the requests of the operation relationship table 900 is executed on a cache memory. In an embodiment of the invention, the table of expected results 1000 is generated by a results analyzer (e.g., (108), FIG. 1). The table of expected results 1000 may compare the simulation results against to assess the reliability of and calibrate the simulator. For example, with continued reference to FIG. 10, the table of expected results 1000 includes the results of two read operations, one read operation starting at record ID 239 and a subsequent read operation starting at record ID 256. In carrying out the first read operation, at record ID 239, a single promotion hit is expected, as discussed with reference to the promote operation at record ID 240, in FIG. 9, and a single promotion miss is expected. In carrying out the second read operation, at record ID 256, a single read miss is expected, in carrying out a subsequent operation at record ID 270, a single read miss is expected, in carrying out a subsequent operation at record ID 280, a single read hit is expected, and in carrying out a last operation at record ID 292, a single read miss is expected. Therefore, when the simulator emulates the operation at the first record, starting at record ID 239, the simulator result is expected to similarly produce: at record ID 239, a single promotion hit and a single promotion miss; at record ID 256, a single read miss; at record ID 270, a single read miss; at record ID 280, a single read hit; and at record ID 292, a single read miss. Any deviation in the simulation results relative to the table of expected results 1000 may be flagged by the results analyzer indicating a potential simulator unreliability that may require simulator calibration, for example.

The workload generator may generate, simultaneously or subsequently to generating the table of expected results 1000, a workload (e.g., step 304, FIG. 3) based on the operation relationship table 900. The workload is input to the simulator (e.g., (104), FIG. 1; Step 308, FIG. 3) and includes the operations the simulator is expected to carry out for emulation.

FIG. 11 shows a non-limiting example of a workload 1100 generated from an operation relationship table (e.g., (900), FIG. 9) and provides the workload 1100 to a simulator (e.g., (104), FIG. 1; Step 308, FIG. 3) for emulating the behavior of a cache memory. The workload 1100 may be generated by a workload generator (e.g., (102) of FIG. 1) based on an operation relationship table (e.g., (900), FIG. 9).

The workload 1100 includes a table of rows and columns where the columns correspond to rows that are arranged by an order of record identifications, "record_id". A row is identified by a corresponding record identification and lists, starting from the left side of the page toward the right side of the page, the address or location of the corresponding operation in LBA, "lba", the number of blocks targeted by the corresponding operation, "blockCount", and the operation to be performed, "operation". It is understood that the workload generated by various embodiments of the invention may have a different, fewer, or a greater number set of attributes of the record than those listed above. Regardless, the workload has a record identification attribute to identify the record for subsequent analysis. The record identification is generally in an ascending order (e.g., 239, 256, 270, 280, and 292), as shown in FIG. 11.

The workload 1100 instructs the simulator to perform: a read operation of 16 blocks, starting at LBA 1076320, in relation to record ID 239; followed by a read operation of 16 blocks, starting at LBA 8494272, in relation to record ID 256; followed by a read operation of 16 blocks, starting at LBA 7880720, in relation to record ID 270; followed by a read operation of 16 blocks, starting at LBA 1048624, in relation to record ID 280; and followed by a read operation of 16 blocks, starting at LBA 11396032, in relation to record ID 292. With reference to the table of expected results 1000 of FIG. 10 and the workload 1100 of FIG. 11, for each record ID, the simulator emulates an operation, at a specified location, and on a specified number of blocks, as instructed by the corresponding request of the workload 1100 and the simulator produces the results of the emulated operation in a table similar to the table of expected results 1000 listed according to the common record IDs between the workload and the simulation results. This guarantees that the simulation results from the simulator can be compared to the expected results from the workload generator (e.g., step 316, FIG. 3). For example, for record ID 239, the simulator emulates a read operation of 16 blocks starting at lba 1076320 and produces results in a table starting at record ID 239, indicating the results of the emulated read operation, i.e., a single promotion hit and a single promotion miss, for record ID 256. Similarly, the simulator emulates a read operation of 16 blocks starting at lba 849472 and produces results in the same table, at record ID 256, with the results of the emulated read operation, i.e., a single read miss, at record ID 256, and so on.

While the examples of FIGS. 6-11 are discussed above and shown in corresponding figures using tables, it is understood that formats other than tables may be employed.

Figure 12:
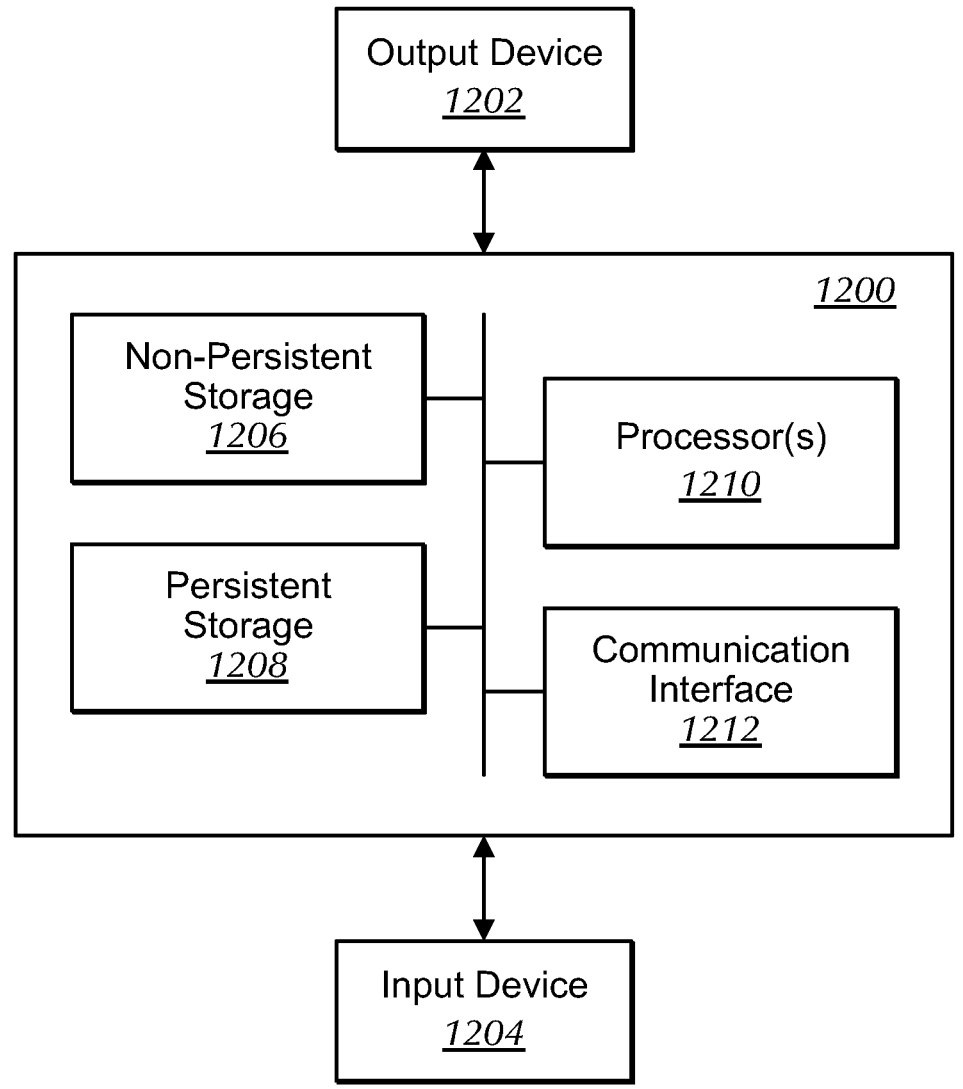
FIG. 12 shows an example computing device in accordance with one or more embodiments described herein.

As discussed above, embodiments of the invention may be implemented using computing devices. FIG. 12 shows a diagram of a computing device in accordance with one or more embodiments of the invention. The computing device (1200) may implement an embodiment of a workload generator (e.g., (102), in FIG. 1; (202), in FIG. 2) or a simulator (e.g., (104) in FIG. 1; (104), in FIG. 2). The computing device (1200) may include one or more computer processors (1210), non-persistent storage (1206) (e.g., volatile memory, such as random access memory (RAM), cache memory), persistent storage (1208) (e.g., a hard disk, an optical drive such as a compact disk (CD) drive or digital versatile disk (DVD) drive, a flash memory, etc.), a communication interface (1212) (e.g., Bluetooth® interface, infrared interface, network interface, optical interface, etc.), input devices (1204), output devices (1202), and numerous other elements (not shown) and functionalities. Each of the components illustrated in FIG. 12 is described below.

In one embodiment of the invention, the computer processor(s) (1210) may be an integrated circuit for processing instructions. For example, the computer processor(s) may be one or more cores or micro-cores of a processor. The computing device (1200) may also include one or more input devices (1204), such as a touchscreen, keyboard, mouse, microphone, touchpad, electronic pen, or any other type of input device. Further, the communication interface (1212) may include an integrated circuit for connecting the computing device (1200) to a network (not shown) (e.g., a local area network (LAN), a wide area network (WAN) such as the Internet, mobile network, or any other type of network) and/or to another device, such as another computing device.

In one embodiment of the invention, the computing device (1200) may include one or more output devices (1202), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (1210), non-persistent storage (1206), and persistent storage (1208). Many different types of computing devices exist, and the aforementioned input and output device(s) may take other forms.

Specific embodiments have been described with reference to the accompanying figures. In the above description, numerous details are set forth as examples. It will be understood by those skilled in the art, and having the benefit of this Detailed Description, that one or more embodiments described herein may be practiced without these specific details and that numerous variations or modifications may be possible without departing from the scope of the embodiments. Certain details known to those of ordinary skill in the art may be omitted to avoid obscuring the description.

In the above description of the figures, any component described with regard to a figure, in various embodiments, may be equivalent to one or more like-named components shown and/or described with regard to any other figure. For brevity, descriptions of these components may not be repeated with regard to each figure. Thus, each and every embodiment of the components of each figure is incorporated by reference and assumed to be optionally present within every other figure having one or more like-named components. Additionally, in accordance with various embodiments described herein, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information may travel may be considered an operative connection.

While embodiments described herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A method of calibrating a simulator instance of a cache memory, the method comprising:
   receiving, by a workload generator, a trace file specifying operations of the cache memory, wherein the operations comprise a set of read and write requests arranged in a sequential order of corresponding record identifications;
   generating, by the workload generator, a workload based on the operations, wherein the workload is to gauge performance of the simulator instance and includes the set of read and write requests arranged in a sequential order of corresponding record identifications;

generating, by the workload generator, expected results based on each request of cache memory in the workload;

receiving, by the simulator instance executing on a simulator emulating behavior of the cache memory, the set of read and write requests from the workload generator;

processing, by the simulator instance, each request of the set of read and write requests in sequential order by emulating read and write operations to the cache memory based on a set of simulation parameters, wherein the simulator instance receives the set of simulation parameters from a default simulation parameter generator, wherein the set of simulation parameters comprises cache memory type and cache memory size, wherein the simulator instance, based on the set of simulation parameters, emulates behavior of the cache memory;

producing, by the simulator instance and based on the workload, simulation results, wherein the simulation results are produced for each request of the set of read and write requests based on emulating read and write operations to the cache memory;

receiving, by the simulator instance executing on the simulator emulating behavior of the cache memory after producing the simulation results, a second set of read and write requests from the workload generator;

processing, by the simulator instance, each request of the second set of read and write requests in sequential order by emulating the read and write operations to the cache memory based on a second set of simulation parameters, wherein the second set of simulation parameters comprises second cache memory type and second cache memory size, wherein the simulator instance, based on the set of simulation parameters, emulates behavior of the cache memory with the second set of simulation parameters;

producing, by the simulator instance and based on the workload, second simulation results, wherein the second simulation results are produced for each request of the second set of read and write requests based on emulating the read and write operations to the cache memory; and calibrating the simulator based on comparison results of the simulation results and the second simulation results compared to the expected results to increase simulation reliability of the simulator, wherein a set of optimal parameters between the set of simulation parameters and the second set of simulation parameters are determined for configuration of the cache memory based on the comparison results, wherein:

comparing the expected results and the simulation results is based on record identifications of the expected results and record identifications of the simulation results, wherein the record identification of the expected results and the simulation results correspond to an order of the operations of the workload generated by the workload generator, wherein the comparison results are provided to an analysis report processor to develop and fine tune cache polices such as pre-fetch and promotion for the cache memory to determine a best cache size, a best cache type and to test reliability of the simulator using the set of optimal parameters.

2. The method of claim 1, wherein the expected results comprise information related to cache hits, cache misses, cache promotions, and cache flushes.

3. The method of claim 1, wherein the read and write requests of the workload are arranged by record identifications corresponding to an ordered subset of the sequential record identifications of the operations of the trace file, and the expected results include results for each of the read and write requests of the workload arranged in the order of the record identifications of the workload.

4. The method of claim 1, wherein the simulator instance is based, at least in part, on a cache simulation framework, which specifies common attributes and procedures of a multi-layered cache simulator.

5. The method of claim 1, further comprising:

receiving an orchestration file including different combinations of configuration parameters for the simulator instance, wherein the processing of the read and write requests to generate the simulation results comprises using the at least a portion of the different combinations of configuration parameters.

6. A device, comprising:

a processor; and memory comprising instructions which, when executed by the processor, perform a method of calibrating a simulator instance of a cache memory, the method comprising:

receiving, by a workload generator, a trace file specifying operations of the cache memory, wherein the operations comprise a set of read and write requests arranged in a sequential order of corresponding record identifications;

generating, by the workload generator, a workload based on the operations, wherein the workload is to gauge performance of the simulator instance and includes the set of read and write requests arranged in a sequential order of corresponding record identifications;

generating, by the workload generator, expected results based on each request of cache memory in the workload;

receiving, by the simulator instance executing on a simulator emulating behavior of the cache memory, the set of read and write requests from the workload generator;

processing, by the simulator instance, each request of the set of read and write requests in sequential order by emulating read and write operations to the cache memory based on a set of simulation parameters, wherein the simulator instance receives the set of simulation parameters from a default simulation parameter generator, wherein the set of simulation parameters comprises cache memory type and cache memory size, wherein the simulator instance, based on the set of simulation parameters, emulates behavior of the cache memory;

producing, by the simulator instance and based on the workload, simulation results, wherein the simulation results are produced for each request of the set of read and write requests based on emulating read and write operations to the cache memory;

receiving, by the simulator instance executing on the simulator emulating behavior of the cache memory after producing the simulation results, a second set of read and write requests from the workload generator;

processing, by the simulator instance, each request of the second set of read and write requests in sequential order by emulating the read and write operations to the cache memory based on a second set of simulation parameters, wherein the second set of simulation parameters comprises second cache memory type and second cache memory size, wherein the simulator instance, based on the set of simulation parameters, emulates behavior of the cache memory with the second set of simulation parameters;

producing, by the simulator instance and based on the workload, second simulation results, wherein the second simulation results are produced for each request of the second set of read and write requests based on emulating the read and write operations to the cache memory; and calibrating the simulator based on comparison results of the simulation results and the second simulation results compared to the expected results to increase simulation reliability of the simulator, wherein a set of optimal parameters between the set of simulation parameters and the second set of simulation parameters are determined for configuration of the cache memory based on the comparison results, wherein:

comparing the expected results and the simulation results is based on record identifications of the expected results and record identifications of the simulation results, wherein the record identification of the expected results and the simulation results correspond to an order of the operations of the workload generated by the workload generator, wherein the comparison results are provided to an analysis report processor to develop and fine tune cache polices such as pre-fetch and promotion for the cache memory to determine a best cache size, a best cache type and to test reliability of the simulator using the set of optimal parameters.

7. The device of claim 6, wherein the expected results comprise information related to cache hits, cache misses, cache promotions, and cache flushes.

8. The device of claim 6, wherein the method further comprises:

the read and write requests of the workload are arranged by record identifications corresponding to an ordered subset of the sequential record identifications of the operations of the trace file, and the expected results include results for each of the read and write requests of the workload arranged in the order of the record identifications of the workload.

9. The device of claim 6, wherein the simulator instance is based, at least in part, on a cache simulation framework, which specifies common attributes and procedures of a multi-layered cache simulator.

10. The device of claim 6, wherein the method further comprises:

receiving an orchestration file including different combinations of configuration parameters for the simulator instance, wherein the processing of the read and write requests to generate the simulation results comprises using the at least a portion of the different combinations of configuration parameters.

11. A non-transitory computer readable medium comprising computer readable program code, which when executed by a computer processor enables the computer processor to perform a method calibrating a simulator instance of a cache memory, the method comprising:

receiving, by a workload generator, a trace file specifying operations of the cache memory, wherein the operations comprise a set of read and write requests arranged in a sequential order of corresponding record identifications;

generating, by the workload generator, a workload based on the operations, wherein the workload is to gauge performance of the simulator instance and includes the set of read and write requests arranged in a sequential order of corresponding record identifications;

generating, by the workload generator, expected results based on each request of cache memory in the workload;

receiving, by the simulator instance executing on a simulator emulating behavior of the cache memory, the set of read and write requests from the workload generator;

processing, by the simulator instance, each request of the set of read and write requests in sequential order by emulating read and write operations to the cache memory based on a set of simulation parameters, wherein the simulator instance receives the set of simulation parameters from a default simulation parameter generator, wherein the set of simulation parameters comprises cache memory type and cache memory size, wherein the simulator instance, based on the set of simulation parameters, emulates behavior of the cache memory;

producing, by the simulator instance and based on the workload, simulation results, wherein the simulation results are produced for each request of the set of read and write requests based on emulating read and write operations to the cache memory;

receiving, by the simulator instance executing on the simulator emulating behavior of the cache memory after producing the simulation results, a second set of read and write requests from the workload generator;

processing, by the simulator instance, each request of the second set of read and write requests in sequential order by emulating the read and write operations to the cache memory based on a second set of simulation parameters, wherein the second set of simulation parameters comprises second cache memory type and second cache memory size, wherein the simulator instance, based on the set of simulation parameters, emulates behavior of the cache memory with the second set of simulation parameters;

producing, by the simulator instance and based on the workload, second simulation results, wherein the second simulation results are produced for each request of the second set of read and write requests based on emulating the read and write operations to the cache memory; and calibrating the simulator based on comparison results of the simulation results and the second simulation results compared to the expected results to increase simulation reliability of the simulator, wherein a set of optimal parameters between the set of simulation parameters and the second set of simulation parameters are determined for configuration of the cache memory based on the comparison results, wherein:

comparing the expected results and the simulation results is based on record identifications of the expected results and record identifications of the simulation results, wherein the record identification of the expected results and the simulation results correspond to an order of the operations of the workload generated by the workload generator, wherein the comparison results are provided to an analysis report processor to develop and fine tune cache polices such as pre-fetch and promotion for the cache memory to determine a best cache size, a best cache type and to test reliability of the simulator using the set of optimal parameters.

* * * * *